(12) United States Patent
Lee et al.

(10) Patent No.: US 9,525,015 B2
(45) Date of Patent: Dec. 20, 2016

(54) ORGANIC LIGHT EMITTING DIODE DEVICE AND METHOD FOR FABRICATING THE SAME

(71) Applicant: LG DISPLAY CO., LTD., Seoul (KR)

(72) Inventors: JiNo Lee, Gyeonggi-do (KR); SangMoo Song, Gyeongsangbuk-do (KR); JungChul Kim, Gyeonggi-do (KR); SeHwan Na, Gyeonggi-do (KR); JiYun Kim, Seoul (KR); Taro Hasumi, Seoul (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 15/068,095

(22) Filed: Mar. 11, 2016

(65) Prior Publication Data

US 2016/0254335 A1 Sep. 1, 2016

Related U.S. Application Data

(62) Division of application No. 14/069,589, filed on Nov. 1, 2013, now Pat. No. 9,312,319.

(30) Foreign Application Priority Data

Dec. 7, 2012 (KR) .......................... 10-2012-0142202

(51) Int. Cl.
*H01L 21/00* (2006.01)
*H01L 35/24* (2006.01)
(Continued)

(52) U.S. Cl.
CPC ....... *H01L 27/3262* (2013.01); *H01L 27/3246* (2013.01); *H01L 27/3248* (2013.01);
(Continued)

(58) Field of Classification Search
CPC ............ H01L 27/3246; H01L 51/5012; H01L 27/3244
(Continued)

(56) References Cited

U.S. PATENT DOCUMENTS 8,247,819 B2 * 8/2012 Kim .................... H01L 51/5206
257/59
8,415,872 B2 * 4/2013 Choi .................. H05B 33/0896
313/498

(Continued)

FOREIGN PATENT DOCUMENTS

CN 101930992 A 12/2010
CN 101995723 A 3/2011
(Continued)

OTHER PUBLICATIONS

Taiwanese Office Action dated Sep. 4, 2015, in Taiwanese Patent Application No. 102144956.
(Continued)

*Primary Examiner* — Theresa T Doan
(74) *Attorney, Agent, or Firm* — Morgan, Lewis & Bockius LLP (57) ABSTRACT

Disclosed are an organic light emitting diode device, and a method for fabricating the same. The organic light emitting diode device comprises a non-active area formed outside an active area of a substrate; a switching thin film transistor and a driving thin film transistor at each of the pixel regions; a planarization layer on the substrate; a first electrode on the planarization layer; a bank formed in the non-active area outside each pixel region; an organic light emitting layer on the first electrode; a second electrode on an entire surface of the substrate; a first passivation layer on the substrate; an organic layer on the first passivation layer; a second passi-
(Continued)

vation layer on the organic layer and the first passivation layer; a barrier film disposed to face the substrate.

7 Claims, 8 Drawing Sheets

(51) Int. Cl.
*H01L 27/32* (2006.01)
*H01L 51/56* (2006.01)
*H01L 51/52* (2006.01)
*H01L 27/12* (2006.01)

(52) U.S. Cl.
CPC ...... *H01L 27/3258* (2013.01); *H01L 27/3276* (2013.01); *H01L 51/5212* (2013.01); *H01L 51/5253* (2013.01); *H01L 51/56* (2013.01); *H01L 27/124* (2013.01); *H01L 27/1248* (2013.01); *H01L 27/1259* (2013.01); *H01L 2227/323* (2013.01)

(58) Field of Classification Search
USPC ........................................ 257/40; 438/82, 99
See application file for complete search history.

(56) References Cited

U.S. PATENT DOCUMENTS

| | | |
|---|---|---|
| 8,895,971 B2 | 11/2014 | Kim et al. |
| 2007/0114519 A1 | 5/2007 | Hayashi |
| 2008/0067932 A1 | 3/2008 | Baek et al. |
| 2010/0066240 A1 | 3/2010 | Park et al. |
| 2010/0320909 A1 | 12/2010 | Izumi |
| 2011/0032460 A1 | 2/2011 | Lee et al. |
| 2012/0256973 A1 | 10/2012 | Choi et al. |
| 2014/0117341 A1 | 5/2014 | Song et al. |

FOREIGN PATENT DOCUMENTS

| | | |
|---|---|---|
| CN | 101930992 B | 8/2012 |
| CN | 102738195 A | 10/2012 |
| JP | 2007-234431 A | 9/2007 |
| TW | I254454 B | 5/2006 |
| TW | I344802 B | 7/2011 |

OTHER PUBLICATIONS

Chinese Office Action dated Dec. 17, 2015, in Chinese Patent Application No. 201310567045.2.

* cited by examiner

ORGANIC LIGHT EMITTING DIODE DEVICE AND METHOD FOR FABRICATING THE SAME

CROSS-REFERENCE TO RELATED APPLICATIONS

This application is a divisional of U.S. patent application Ser. No. 14/069,589, filed on Nov. 1, 2013, which, pursuant to 35 U.S.C. §119(a), claims the benefit of earlier filing date and right of priority to Korean Application No. 10-2012-0142202, filed on Dec. 7, 2012, the entire contents of each of which is incorporated by reference herein for all purposes.

BACKGROUND OF THE DISCLOSURE

1. Field of the Disclosure

The present disclosure relates to an organic light emitting diode device (hereinafter, will be referred to as "OLED" device), and particularly, to an OLED device capable of having an enhanced environment reliability by preventing moisture from being introduced thereinto from outside, and a method for fabricating the same.

2. Background of the Disclosure

An organic light-emitting diode (OLED) device, one of flat panel display devices, has high brightness and a low operation voltage. Further, the OLED device has a high contrast ratio because it is a spontaneous light-emitting type, and it can implement a display of an ultra thin thickness. The OLED device can easily implement moving images due to a short response time corresponding to several micro seconds (μs). Besides, the OLED device has no limitation in a viewing angle, and has a stable characteristic even at a low temperature. Further, as the OLED device is driven at a low voltage such as a direct current of 5-15 v, it is easy to fabricate and design driving circuits.

The OLED device can be fabricated in a very simple manner, because only deposition and encapsulation equipment is required.

The OLED device having such characteristics is largely categorized into a passive matrix type and an active matrix type. In the passive matrix type, scan lines and signal lines cross each other to form an OLED device in a matrix form. In order to drive each pixel, the scan lines are sequentially driven. Accordingly, for a required average brightness, an instantaneous brightness, a value obtained by multiplying an average brightness by the number of lines, should be implemented.

On the other hand, in the active matrix type, a thin film transistor (TFT), a switching device for turning on/off a pixel region, is located at each pixel region. A driving thin film transistor connected to the switching thin film transistor is connected to a power line and a light-emitting diode, and is formed at each pixel region.

A first electrode connected to the driving thin film transistor is turned on/off in unit of a pixel region, and a second electrode facing the first electrode serves as a common electrode. The first electrode, the second electrode, and an organic light-emitting layer interposed between the two electrodes constitute the light-emitting diode.

In such active matrix type, a voltage applied to a pixel region is charged in a storage capacitor (Cst). Power should be applied to the OLED device until a subsequent frame signal is applied to the OLED device. Under such configuration, the OLED device is continuously driven for a single frame, regardless of the number of scan lines.

Even if a low current is applied to the OLED device, the same brightness is implemented. Owing to characteristics of low power consumption, high resolution and a large screen, the active matrix type is being spotlighted in recent years.

A basic structure and an operation characteristic of such active matrix type OLED device will be explained with reference to the attached drawings.

Figure 1:
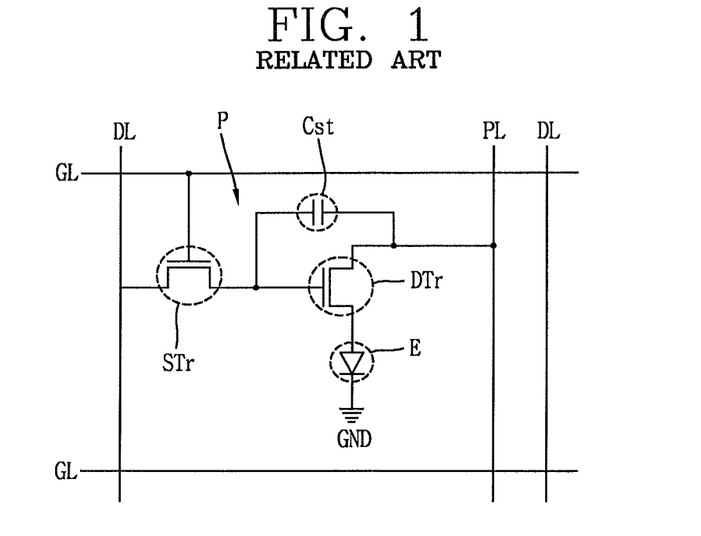
FIG. 1 is a circuit diagram illustrating a configuration of a single pixel region of an active matrix type organic light emitting diode (OLED) device in accordance with the conventional art.

FIG. 1 is a circuit diagram illustrating a configuration of a single pixel region of an active matrix type OLED device in accordance with the conventional art.

Referring to FIG. 1, a single pixel region of an active matrix type OLED device is composed of a switching thin film transistor (STr), a driving thin film transistor (DTr), a storage capacitor (Cst) and a light-emitting diode (E).

Gate lines (GL) are formed in a first direction, and data lines (DL) are formed in a second direction perpendicular to the first direction, thereby defining pixel regions (P). A power line (PL) for applying a power voltage to the OLED device is spaced from the data line (DL).

A switching thin film transistor (STr) is formed at an intersection between the data line (DL) and the gate line (GL), and a driving thin film transistor (DTr) electrically connected to the switching thin film transistor (STr) is formed in each pixel region (P).

The DTr is electrically connected to a light-emitting diode (E). More specifically, a first electrode, a terminal disposed at one side of the light-emitting diode (E) is connected to a drain electrode of the DTr. A second electrode, a terminal disposed at another side of the light-emitting diode (E) is connected to a power line (PL). The power line (PL) transmits a power voltage to the light-emitting diode (E). A storage capacitor (Cst) is formed between a gate electrode and a source electrode of the DTr.

Once a signal is applied to the OLED device through the gate lines (GL), the STr is turned on. And the DTr is turned on as a signal of the data lines (DL) is transmitted to the gate electrode thereof. Accordingly, light is emitted through the light-emitting diode (E). If the DTr is turned on, a level of a current applied to the light-emitting diode (E) from the power line (PL) is determined. As a result, the light-emitting diode (E) can implement a gray scale.

The storage capacitor (Cst) serves to maintain a gate voltage of the DTr constantly when the STr is turned off. Accordingly, even if the STr is turned off, a level of a current applied to the light-emitting diode (E) can be constantly maintained for the next frame.

Figure 2:
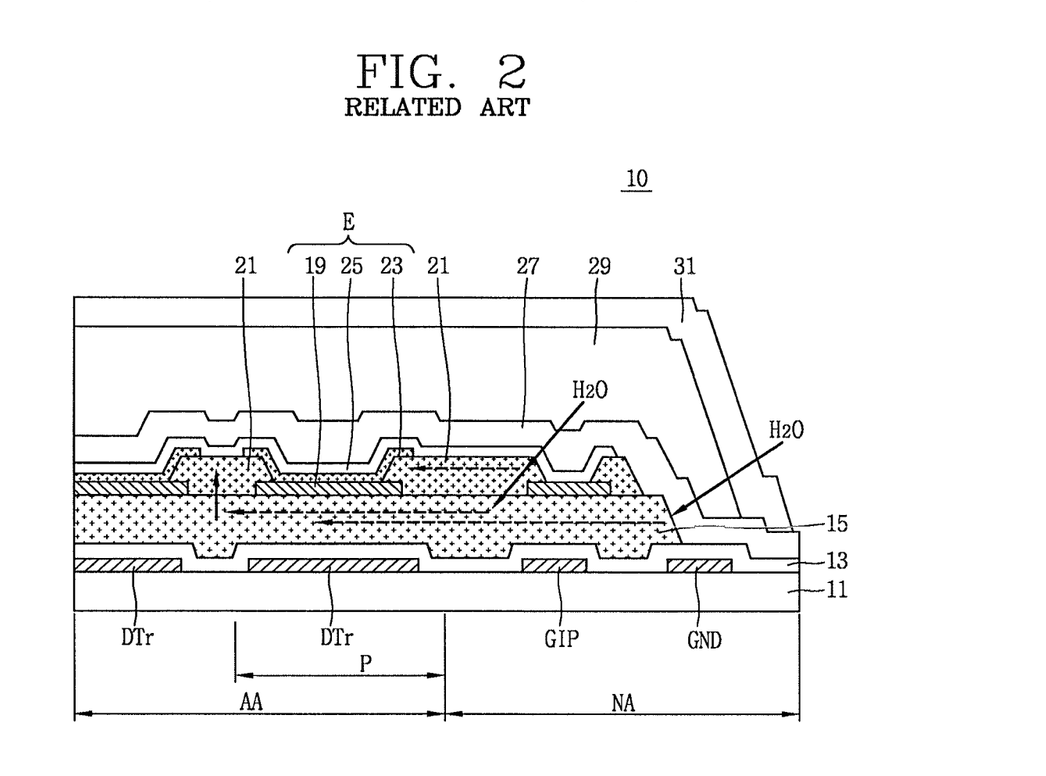
FIG. 2 is a sectional view schematically illustrating an OLED device in accordance with the conventional art.

FIG. 2 is a sectional view schematically illustrating an OLED device in accordance with the conventional art.

Referring to FIG. 2, in the conventional OLED device 10, an active area (AA, display region) and a non-active area (NA, non-display region) formed outside the active area (AA) are defined on a substrate 11. A plurality of pixel regions (P) defined by gate lines (not shown) and data lines (not shown) are formed at the active area (AA). A power line (not shown) is formed in parallel to the data lines (not shown).

A switching thin film transistor (not shown) and a driving thin film transistor (DTr) are formed at each pixel region (P).

In the conventional organic light-emitting diode device 10, the substrate 11, where the DTr and the light-emitting diode (E) have been formed, is encapsulated by a barrier film (not shown).

The conventional OLED device 10 will be explained in more detail. As shown in FIG. 2, an active area (AA) and a non-active area (NA) formed outside the active area (AA) are defined on a substrate 11. A plurality of pixel regions (P) defined by gate lines (not shown) and data lines (not shown)

are formed at the active area (AA). A power line (not shown) is formed in parallel to the data lines (not shown).

A plurality of driving circuit lines (GIP), ground lines (GND), etc. are formed in the non-active area (NA) of the substrate 11.

Although not shown, the DTr is composed of a semiconductor layer, a gate insulating layer, a gate electrode formed on the gate insulating layer on the semiconductor layer, a source electrode and a drain electrode. The source electrode and the drain electrode are formed on an interlayer insulating layer formed on the gate insulating layer including the gate electrode, and are spaced from each other.

An interlayer insulating layer 13 having a drain contact hole (not shown) through which a drain electrode (not shown) of the DTr is exposed to outside, and an organic planarization layer 15 are formed on the DTr and the switching thin film transistor (not shown).

A first electrode 19, contacting the drain electrode (not shown) of the DTr through the drain contact hole (not shown) and provided for each pixel region (P) in a separated manner, is formed on the organic planarization layer 15.

A bank 212, by which the pixel regions (P) are separated from each other, is formed on the first electrode 19. The bank 21 is disposed between the pixel regions (P) adjacent to each other. The bank 21 is also formed in the non-active area (NA), i.e., at an outer portion of a panel.

An organic light-emitting layer 23, composed of organic light-emitting patterns (not shown) which emit red, green and blue light, is formed on the first electrode 19 in each pixel (P) enclosed by the bank 21.

A second electrode 25, a cathode is formed on the organic light-emitting layer 23 and the bank 21, in both of the active area (AA) and the non-active area (NA). The first electrode 19, the second electrode 25, and the organic light-emitting layer 23 interposed between the two electrodes 19, 25 constitute a light-emitting diode (E).

A first passivation layer 27, an insulating layer for preventing introduction of moisture into the OLED device 10, is formed on the entire surface of the substrate 11 including the second electrode 25.

An organic layer 29, formed of an organic material such as a polymer, is formed on the first passivation layer 27 at the active area (AA).

A second passivation layer 31, configured to prevent introduction of moisture into the OLED device 10 through the organic layer 29, is further formed over the first passivation layer 27 including the organic layer 29.

A barrier film (not shown) is positioned on the entire surface of the substrate including the second passivation layer 31 in a facing manner, for encapsulation of the light-emitting diode (E) and for prevention of introduction of moisture from the upper side. An adhesive (not shown, will be referred to as 'Press Sensitive Adhesive', PSA) is interposed between the substrate 11 and the barrier film (not shown), so that the substrate 11 and the barrier film can be completely attached to each other without an air layer therebetween. The second passivation layer 31, the adhesive (not shown) and the barrier film (not shown) have a face seal structure.

As the substrate 11 and the barrier film (not shown) are attached to each other by the adhesive (not shown) to thus form a panel, the OLED device 10 according to the conventional art is implemented.

However, the conventional OLED device may have the following problems.

Firstly, when a defect occurs in the face seal structure, e.g., the barrier film, the adhesive, etc., moisture ($H_2O$) is rapidly introduced into an active area (AA) through a planarization layer. In order to solve such problem, a planarization layer may not be formed at a non-active area (NA). However, in this case, an inorganic insulating layer such as the passivation layer disposed on the OLED device has a degraded quality due to a stair-shaped portion.

Secondly, when a defect occurs in the face seal structure, e.g., the barrier film, the adhesive, etc., moisture ($H_2O$) is rapidly introduced into the active area (AA) through a bank. In order to solve such problem, a bank may not be formed in the non-active area (NA). However, in this case, moisture may spread through a planarization layer to cause a problem.

SUMMARY OF THE DISCLOSURE

Therefore, an aspect of the detailed description is to provide an organic light-emitting diode (OLED) device capable of having an enhanced environment reliability by preventing moisture from being introduced into an active area from outside, by forming moisture blocking portions at a planarization layer in a non-active area, and a method for fabricating the same.

To achieve these and other advantages and in accordance with the purpose of this specification, as embodied and broadly described herein, there is provided an organic light emitting diode device, comprising: a substrate divided into an active area including a plurality of pixel regions, and a non-active area formed outside the active area; a switching thin film transistor and a driving thin film transistor formed at each of the pixel regions on the substrate; a planarization layer formed on the substrate including the switching thin film transistor and the driving thin film transistor, and provided with a moisture blocking portion in the non-active area of the substrate; a first electrode formed on the planarization layer, and connected to a drain electrode of the driving thin film transistor; a bank formed in the non-active area outside each pixel region of the substrate including the first electrode; an organic light emitting layer formed on the first electrode, and provided for each pixel region in a separated manner; a second electrode formed on an entire surface of the substrate including the organic light emitting layer; a first passivation layer formed on an entire surface of the substrate including the second electrode; an organic layer formed on the first passivation layer; a second passivation layer formed on the organic layer and the first passivation layer; a barrier film disposed to face the substrate; and an adhesive interposed between the substrate and the barrier film, and configured to attach the substrate and the barrier film to each other to thus implement a panel state.

To achieve these and other advantages and in accordance with the purpose of this specification, as embodied and broadly described herein, there is also provided a method for fabricating an organic light emitting diode device, the method comprising: providing a substrate divided into an active area including a plurality of pixel regions, and a non-active area formed outside the active area; forming a switching thin film transistor and a driving thin film transistor at each of the pixel regions on the substrate; forming a planarization layer on the substrate including the switching thin film transistor and the driving thin film transistor; forming a moisture blocking portion at the planarization layer in the non-active area; forming, on the planarization layer, a first electrode connected to a drain electrode of the driving thin film transistor; forming a bank in the non-active area outside each pixel region of the substrate including the first electrode; forming an organic light emitting layer on the first electrode in the pixel region; forming a second electrode on an entire surface of the substrate including the organic light emitting layer; forming a first passivation layer on an entire surface of the substrate including the second electrode; forming an organic layer on the first passivation layer; forming a second passivation layer on the organic layer and the first passivation layer; forming a barrier film so as to face the substrate; and forming an adhesive between the substrate and the barrier film, the adhesive configured to attach the substrate and the barrier film to each other to thus implement a panel state.

The present invention can have the following advantages.

Firstly, owing to the moisture blocking portions formed at the planarization layer in the non-active area, foreign materials or moisture generated from the first passivation layer, the second passivation layer, etc. due to occurrence of a crack can be prevented from being introduced into the active area.

Foreign materials or moisture inside the planarization layer, which may cause degradation of organic materials inside a light-emitting region, can be outgassed through the anode holes formed at the auxiliary electrode pattern disposed in the non-active area. The anode holes, through which the planarization layer and the bank are connected to each other, may serve as a path through which moisture introduced from outside flows to the active area (AA). However, even if moisture introduced from outside flows through the anode holes, the moisture can be prevented from moving to the active area (AA) by the moisture blocking portions of the planarization layer formed below the auxiliary electrode pattern. This can allow a top emission type OLED device adopting a face seal structure, to have an enhanced environment reliability.

Further scope of applicability of the present application will become more apparent from the detailed description given hereinafter. However, it should be understood that the detailed description and specific examples, while indicating preferred embodiments of the disclosure, are given by way of illustration only, since various changes and modifications within the spirit and scope of the disclosure will become apparent to those skilled in the art from the detailed description.

BRIEF DESCRIPTION OF THE DRAWINGS

The accompanying drawings, which are included to provide a further understanding of the disclosure and are incorporated in and constitute a part of this specification, illustrate exemplary embodiments and together with the description serve to explain the principles of the disclosure.

In the drawings.

DETAILED DESCRIPTION OF THE DISCLOSURE

Description will now be given in detail of the exemplary embodiments, with reference to the accompanying drawings. For the sake of brief description with reference to the drawings, the same or equivalent components will be provided with the same reference numbers, and description thereof will not be repeated.

An organic light emitting diode (OLED) device according to the present invention is categorized into a top emission type and a bottom emission type according to a propagation direction of emitted light. Hereinafter, a top emission type OLED device will be explained.

Figure 3:
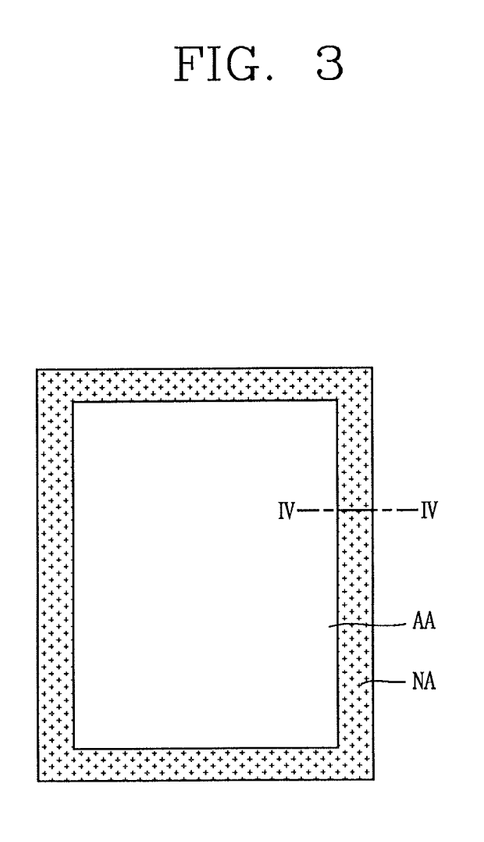
FIG. 3 is a planar view schematically illustrating an OLED device according to the present invention.
Figure 4:
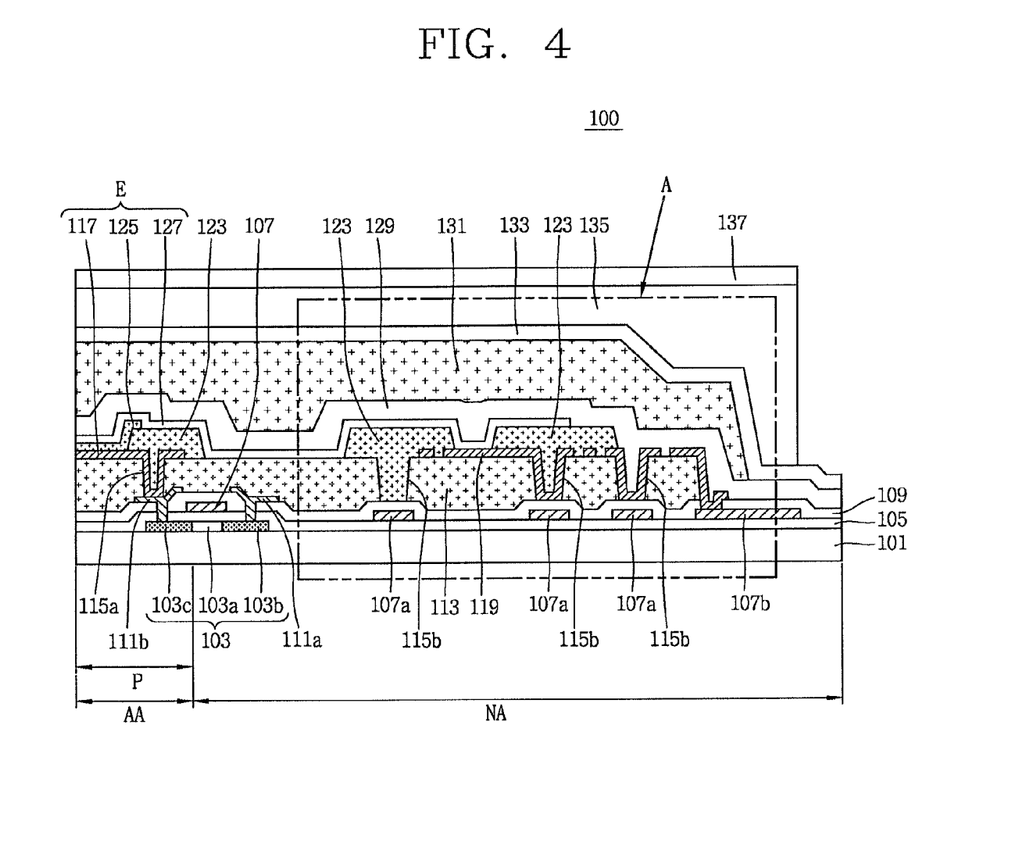
FIG. 4 is a sectional view taken along line 'IV-IV' in FIG. 3, which schematically illustrates an OLED device according to the present invention.
Figure 5:
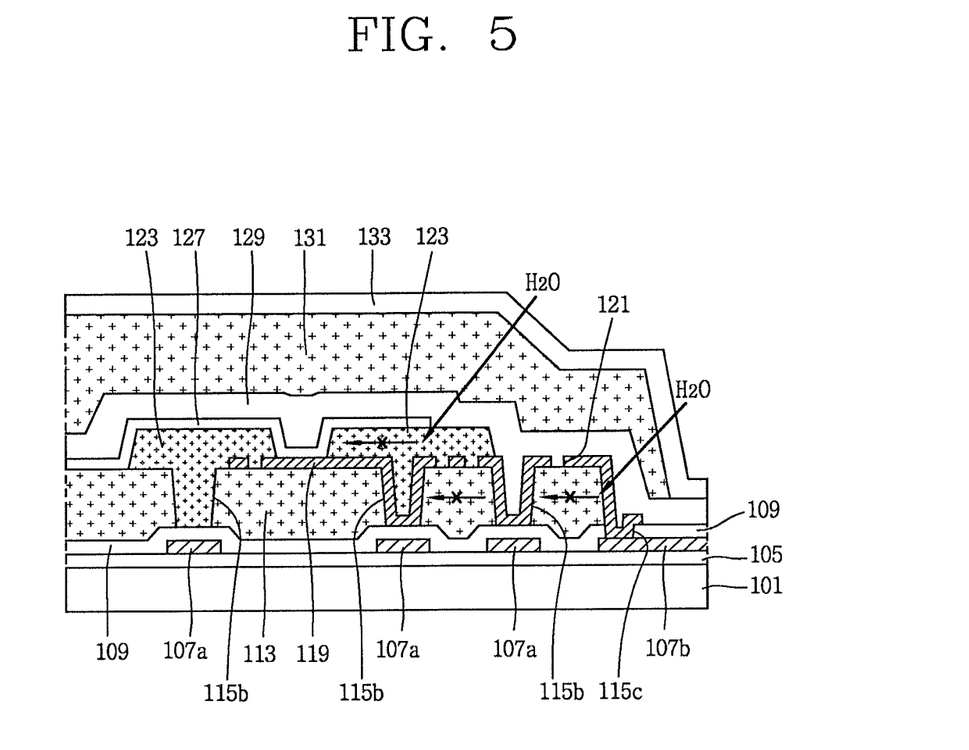
FIG. 5 is an enlarged sectional view of part 'A' in FIG. 4, which illustrates that introduction of moisture from a moisture blocking portion of a planarization layer and a metallic pattern is prevented.

FIG. 3 is a planar view schematically illustrating an OLED device according to the present invention, FIG. 4 is a sectional view taken along line 'IV-IV' in FIG. 3, which schematically illustrates an OLED device according to the present invention, and FIG. 5 is an enlarged sectional view of part 'A' in FIG. 4, which illustrates that introduction of moisture from a moisture blocking portion of a planarization layer and a metallic pattern is prevented.

Referring to FIGS. 3 to 5, an OLED device 100 according to the present invention has a structure that a substrate 101 where a driving thin film transistor (DTr) and a light-emitting diode (E) is encapsulated by a barrier film 137.

Referring to FIGS. 3 and 4, the OLED device 100 comprises a substrate 101 divided into an active area (AA, display region) including a plurality of pixel regions (P), and a non-active area (NA, non-display region) formed outside the active area (AA); a switching thin film transistor (not shown) and a driving thin film transistor (DTr) formed at each pixel region (P) on the substrate 101; a planarization layer 113 formed on the substrate 101 including the switching TFT and the DTr, and provided with moisture blocking portions 115b in the non-active area (NA) of the substrate; a first electrode 117 formed on the planarization layer 113, and connected to a drain electrode 111 of the DTr; a bank 123 formed in the non-active area (NA) outside each pixel region (P) of the substrate including the first electrode 117; an organic light emitting layer 123 formed on the first electrode 117, and provided for each pixel region (P) in a separated manner; a second electrode 127 formed on an entire surface of the substrate including the organic light emitting layer 123; a first passivation layer 129 formed on an entire surface of the substrate including the second electrode 127; an organic layer 131 formed on the first passivation layer 129; a second passivation layer 133 formed on the organic layer 131 and the first passivation layer 129; a barrier film 137 disposed to face the substrate 101; and an adhesive interposed between the substrate 101 and the barrier film 137, and configured to attach the substrate 101 and the barrier film 137 to each other to thus implement a panel state.

The OLED device 100 according to the present invention will be explained in more detail. As shown in FIGS. 3 to 5, the substrate 101 is divided into an active area (AA), and a non-active area (NA) formed outside the active area (AA). A plurality of pixel regions (P) defined by gate lines (not shown) and data lines (not shown) are provided at the active area (AA). A power line (not shown) is provided in parallel to the data lines (not shown).

As the substrate 101, a glass substrate or a flexible substrate may be used. The flexible substrate may be formed of glass or plastic having a flexible characteristic so that the OLED device 100 can maintain a display performance even when folded or rolled-up like paper.

A buffer layer (not shown), formed of an insulating material, e.g., an inorganic insulating material such as silicon dioxide ($SiO_2$) or silicon nitride ($SiNx$), is formed on the substrate 101. The reason why the buffer layer (not shown) is formed below a semiconductor layer 103 formed during a subsequent process, is in order to prevent degradation of characteristics of the semiconductor layer 103 due to emission of alkali ions from inside of the substrate 101 when the semiconductor layer 103 is crystallized.

The semiconductor layer 103 is formed at each pixel region (P) in the active area (AA) above the buffer layer (not shown). The semiconductor layer 103 is formed in correspondence to a driving region (not shown) and a switching region (not shown). And the semiconductor layer 103 is composed of a first region 103a formed of pure poly silicone and forming a channel; and second regions 103b and 103c formed of pure poly silicone, disposed at two sides of the first region 103a, and to which impurities of high concentration are doped.

A gate insulating layer 105 is formed on the buffer layer including the semiconductor layer 103. A gate electrode 107 is formed on the gate insulating layer 105 in correspondence to the first region 103a of the semiconductor layer 103 in the driving region (not shown) and the switching region (not shown).

The gate line (not shown), connected to the gate electrode 107 formed at the switching region (not shown) and extending to one direction, is formed on the gate insulating layer 105. The gate electrode 107 and the gate line (not shown) may have a single layer structure, by being formed of a first metallic material having a low resistance characteristic, e.g., aluminum (Al), aluminum alloy (AlNd), copper (Cu), copper alloy, molybdenum (Mo), and molybdenum titanium (MoTi). Alternatively, the gate electrode 107 and the gate line (not shown) may have a double-layered or three-layered structure by being formed of more than two of the first metallic materials. In drawings, the gate electrode 107 and the gate line (not shown) have a single-layered structure. When the gate electrode 107 is formed, gate driving circuit lines (GIP) 107a and ground lines (GND) 107b are simultaneously formed in the non-active area (NA) of the substrate 101.

An interlayer insulating layer 109, formed of an insulating material, e.g., an inorganic insulating material such as silicon dioxide ($SiO_2$) or silicon nitride ($SiNx$), is formed on an entire surface of the substrate including the gate electrode 107 and the gate line (not shown), in the active area. Semiconductor layer contact holes (not shown), through which the second regions 103b and 103c disposed at two sides of the first region 103a of the semiconductor layer 103 are exposed to outside, are provided at the interlayer insulating layer 109 and the gate insulating layer 105 formed therebelow.

Data lines (not shown), which define the pixel regions (P) by crossing the gate lines (not shown) and formed of a second metallic material layer, are formed on the interlayer insulting layer 109 including the semiconductor layer contact holes (not shown). The second metallic material layer may be formed of one of aluminum (Al), aluminum alloy (AlNd), copper (Cu), copper alloy, molybdenum (Mo), molybdenum titanium (MoTi), chrome (Cr) and titanium (Ti), or a combination of at least two of them. A power line (not shown) is formed in a spaced manner from the data lines. The power line (not shown) may be formed on the gate insulating layer 105 where the gate lines (not shown) have been formed, in a spaced manner from the gate lines (not shown), in parallel thereto.

As shown in FIGS. 4 and 5, a source electrode 111a and a drain electrode 111b, made of the same second metallic material as the data lines (not shown), are formed at a driving region (not shown) and a switching region (not shown) on the interlayer insulating layer 109. The source electrode 111a and the drain electrode 111b are spaced from each other, and contact the second regions 103b and 103c exposed to outside through the semiconductor layer contact holes (not shown). Under such configuration, the semiconductor layer 103, the gate insulating layer 105, the gate electrode 107 and the interlayer insulating layer 109 sequentially deposited on the driving region (not shown), form a driving thin film transistor (not shown, refer to the DTr of FIG. 6B), together with the source electrode 111a and the drain electrode 111b which are spaced from each other.

In drawings, all of the data lines (not shown), the source electrode 111a and the drain electrode 111b have a single-layered structure. However, the data lines (not shown), the source electrode 111a and the drain electrode 111b may have a double-layered structure or a three-layered structure.

Although not shown, a switching thin film transistor (not shown), which has the same lamination structure as the driving thin film transistor (DTr), is also formed at the switching region (not shown). The switching thin film transistor (not shown) is electrically connected to the driving thin film transistor (DTr), the gate line (not shown) and the data line (not shown). That is, the gate line (not shown) and the data line (not shown) are connected to a gate electrode (not shown) and a source electrode (not shown) of the switching thin film transistor, respectively. And a drain electrode (not shown) of the switching thin film transistor (not shown) is electrically connected to the gate electrode 107 of the driving thin film transistor (DTr).

The driving thin film transistor (DTr) and the switching thin film transistor (not shown) have the semiconductor layer 103 formed of poly silicon, and are configured as a top gate type. However, the driving thin film transistor (DTr) and the switching thin film transistor (not shown) may be configured as a bottom gate type which has a semiconductor layer formed of amorphous silicon.

In a case where the driving thin film transistor (DTr) and the switching thin film transistor (not shown) are configured as a bottom gate type, they may have a lamination structure of a gate electrode/a gate insulating layer/a semiconductor layer composed of one active layer formed of pure amorphous silicon, and two ohmic layers formed of impurity amorphous silicon and disposed at two sides of the active layer/and a source electrode and a drain electrode spaced from each other. The gate line is formed so as to be connected to the gate electrode of the switching thin film transistor. And the date line is formed so as to be connected to the source electrode.

A planarization layer 113, having a drain contact hole (not shown) through which the drain electrode 111b of the driving thin film transistor (DTr) is exposed to outside, is formed on the driving thin film transistor (DTr) and the switching thin film transistor (not shown). The planarization layer 113 may be formed of an insulating material. For instance, the planarization layer 113 may be formed of one of an inorganic insulating material including silicon dioxide ($SiO_2$) and silicon nitride ($SiNx$), and an organic insulating material including photo-acryl. In the present invention, the planarization layer 113 is formed of an organic insulating material.

A drain contact hole 115a, through which the first electrode 117 formed during a subsequent process is electrically connected to the drain electrode 111b, is formed at the planarization layer 113 in the active area of the substrate 101.

A plurality of moisture blocking portions 115b, configured to prevent moisture from being introduced into the active area from outside, are formed at the planarization layer 113 in the non-active area of the substrate 101. Each of the moisture blocking portions 115b is formed as the planarization layer 113 disposed in the non-active area (NA) of the substrate 101 is cut-out with a prescribed width, which is formed along an edge region of the non-active area (NA) of the substrate 101. The moisture blocking portions 115b are formed at the planarization layer 113 positioned above a driving circuit line to which a direct current (DC) is applied, among the ground lines 107b.

Under such configuration, even if moisture is introduced into the OLED device from outside, the moisture is not introduced to the active area (AA) due to the moisture blocking portions 115b of the planarization layer 113 in the non-active area (NA). That is, the moisture blocking portions 115b are formed by cutting the planarization layer 113 which serves as a path along which moisture is introduced. Under such configuration, even if moisture is introduced through the planarization layer 113, the moisture moves up to the moisture blocking portions 115b without moving to the planarization layer in the active area (AA).

The first electrode 117, which contacts the drain electrode 111b of the driving thin film transistor (DTr) through the drain contact hole (not shown), is formed on the planarization layer 113 in a separated manner for each pixel region (P). An auxiliary electrode pattern 119, configured to lower a resistance of the second electrode 127, a cathode formed during a subsequent process, is simultaneously formed on the planarization layer 113 in the non-active area (NA). As the second electrode 127 formed of a transparent conductive material has a large resistance, a problem may occur when a constant current is applied to the second electrode 127. In order to solve such problem, the auxiliary electrode pattern 119 is electrically connected to the second electrode 127 to thus lower a resistance of the second electrode 127. The auxiliary electrode pattern 119 is electrically connected to the second electrode 127 and the ground line 107b. The auxiliary electrode pattern 119 is electrically connected to the ground line 107b via a ground line contact hole (not shown, refer to 115c of FIG. 5).

In order to outgas foreign materials or moisture generated in the planarization layer 113 and which may cause degradation of organic materials inside a light emitting region, anode holes 121 are formed at the auxiliary electrode pattern 119 disposed in the non-active area (NA). As the planarization layer 113 and a bank 123 are connected to each other through the anode holes 121, moisture ($H_2O$) introduced into the OLED device from outside may flow toward the active area (AA) through the anode holes 121. However, in this case, the moisture is prevented from being introduced to the active area (AA), by the moisture blocking portions 115b of the planarization layer 113 formed below the auxiliary electrode pattern 119.

The bank 123, made of an insulating material, such as benzocyclobutene (BCB), polyimide or photo acryl, is formed on the first electrode 117, in the non-active area (NA) outside each pixel region (P). The bank 123 is formed to overlap the edge of the first electrode 117 with enclosing each pixel (P), and has a lattice shape having a plurality of openings in the entire active area (A/A). The bank 123 is also formed in the non-active area (NA), i.e., at an outer portion of a panel.

An organic light-emitting layer 125, composed of organic light-emitting patterns (not shown) which emit red, green and blue light, is formed on the first electrode 117 in each pixel (P) enclosed by the bank 123. The organic light-emitting layer 125 may be configured as a single layer formed of an organic light-emitting material. Although not shown, for enhanced light-emitting efficiency, the organic light-emitting layer 125 may be configured as a multi-layer formed of a hole injection layer, a hole transporting layer, an emitting material layer, an electron transporting layer and an electron injection layer.

The second electrode 127 is formed on the active area (AA) of the substrate including the organic light-emitting layer 125 and the bank 123. The first electrode 117, the second electrode 127, and the organic light-emitting layer 125 interposed between the two electrodes 121a, 127 form a light-emitting diode (E). The second electrode 127 is electrically connected to the auxiliary electrode pattern 119.

In the light-emitting diode (E), once a prescribed voltage is applied to the first electrode 117 and the second electrode 127 according to a selected color signal, a hole injected from the first electrode 117 and an electron provided from the second electrode 127 are transferred to the organic light-emitting layer 125 to thus form exciton. When the exciton is transited from an excited state to a ground state, light is generated to be emitted in the form of visible rays. As the generated light is emitted to outside through the transparent second electrode 127, the OLED device 100 implements desired images.

The first passivation layer 129, made of an insulating material, especially, an inorganic insulating material such as silicon dioxide ($SiO_2$) or silicon nitride (SiNx), is formed on the entire surface of the substrate 101 including the second electrode 127. The second electrode 127 alone cannot prevent introduction of moisture into the organic light-emitting layer 125. Accordingly, the first passivation layer 129 is formed on the second electrode 127 to completely prevent introduction of moisture into the organic light-emitting layer 125.

The organic layer 131, made of an organic material such as polymer, is formed on the first passivation layer 129. As the polymer of the organic layer 131, may be used olefine-based polymer (polyethylene, polypropylene), polyethylene terephthalate (PET), epoxy resin, fluoro resin, polysiloxane, etc.

For prevention of introduction of moisture into the OLED device through the organic layer 131, a second passivation layer 133, made of an insulating material, e.g., an inorganic insulating material such as silicon dioxide ($SiO_2$) or silicon nitride (SiNx), is further formed on the entire surface of the substrate 101 including the organic layer 131 and the first passivation layer 129.

A barrier film 137 is positioned on the entire surface of the substrate 101 including the second passivation layer 133 in a facing manner, for encapsulation of the light-emitting diode (E). An adhesive 135 is interposed between the substrate 101 and the barrier film 137, so that the substrate 101 and the barrier film 137 can be completely attached to each other without an air layer therebetween. The adhesive 135 is formed of one of transparent frit having an adhesion property, an organic insulating material and a polymer material. In the present invention, the adhesive 135 is configured as a press sensitive adhesive (PSA).

As the substrate 101 and the barrier film 137 are attached to each other by the adhesive 135 to thus form a panel, the OLED device 100 according to the present invention is implemented.

In the OLED device according to the present invention, the moisture blocking portions are formed at the planarization layer in the non-active area. Foreign materials or moisture inside the planarization layer, which may cause degradation of organic materials inside a light-emitting region, can be outgassed through the anode holes formed at the auxiliary electrode pattern disposed in the non-active area (NA). The anode holes, through which the planarization layer and the bank are connected to each other, may serve as a path through which moisture introduced from outside flows to the active area (AA). However, even if moisture introduced from outside flows through the anode holes, the moisture can be prevented from moving to the active area (AA) by the moisture blocking portions of the planarization layer formed below the auxiliary electrode pattern. This can allow a top emission type OLED device adopting a face seal structure, to have an enhanced environment reliability.

In the OLED device according to the present invention, moisture is prevented from being introduced to the active area (AA) by the moisture blocking portions of the planarization layer formed below the auxiliary electrode pattern. This can allow a top emission type OLED device adopting a face seal structure, to have an enhanced environment reliability.

Hereinafter, processes for fabricating an OLED device according to the present invention will be explained with reference to FIGS. 6A to 6H.

FIGS. 6A to 6H are sectional views illustrating processes for fabricating an OLED device according to the present invention.

Figure 6A:
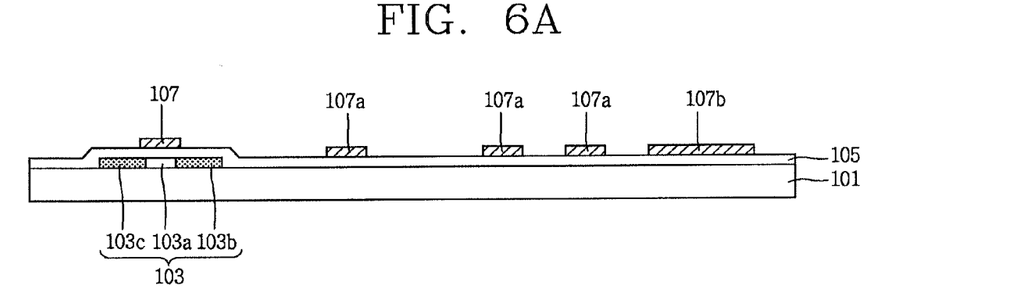
FIGS. 6A to 6H are sectional views illustrating processes for fabricating an OLED device according to the present invention.

As shown in FIG. 6A, prepared is a substrate 101 divided into an active area (AA), and a non-active area (NA) formed outside the active area (AA). As the substrate 101, a glass substrate or a flexible substrate may be used. The flexible substrate may be formed of glass or plastic having a flexible characteristic so that an OLED device can maintain a display performance even when folded or rolled-up like paper.

A buffer layer (not shown), formed of an insulating material, e.g., an inorganic insulating material such as silicon dioxide ($SiO_2$) or silicon nitride (SiNx), is formed on the substrate 101. The reason why the buffer layer (not shown) is formed below a semiconductor layer 103 formed during a subsequent process, is in order to prevent degradation of characteristics of the semiconductor layer 103 due to emission of alkali ions from inside of the substrate 101 when the semiconductor layer 103 is crystallized.

The semiconductor layer 103 is formed above the buffer layer (not shown) at each pixel region (P) in the active area (AA). The semiconductor layer 103 is formed in correspondence to the driving region (not shown) and the switching region (not shown). And the semiconductor layer 103 is composed of a first region 103a formed of pure poly silicone and forming a channel; and second regions 103b and 103c formed of pure poly silicone, disposed at two sides of the first region 103a, and to which impurities of high concentration are doped.

A gate insulating layer 105 is formed on the buffer layer including the semiconductor layer 103. A gate electrode 107 is formed on the gate insulating layer 105 in correspondence to the first region 103a of the semiconductor layer 103 in the driving region (not shown) and the switching region (not shown).

A gate line (not shown), connected to the gate electrode 107 formed at the switching region (not shown) and extending to one direction, is formed on the gate insulating layer 105. The gate electrode 107 and the gate line (not shown) may have a single layer structure, by being formed of a first metallic material having a low resistance characteristic, e.g., aluminum (Al), aluminum alloy (AlNd), copper (Cu), copper alloy, molybdenum (Mo), and molybdenum titanium (MoTi). Alternatively, the gate electrode 107 and the gate line (not shown) may have a double-layered or three-layered structure by being formed of more than two of the first metallic materials. In drawings, the gate electrode 107 and the gate line (not shown) have a single-layered structure. When the gate electrode 107 is formed, gate driving circuit lines (GIP) 107a and ground lines (GND) 107b are simultaneously formed in the non-active area (NA) of the substrate 101.

Figure 6B:
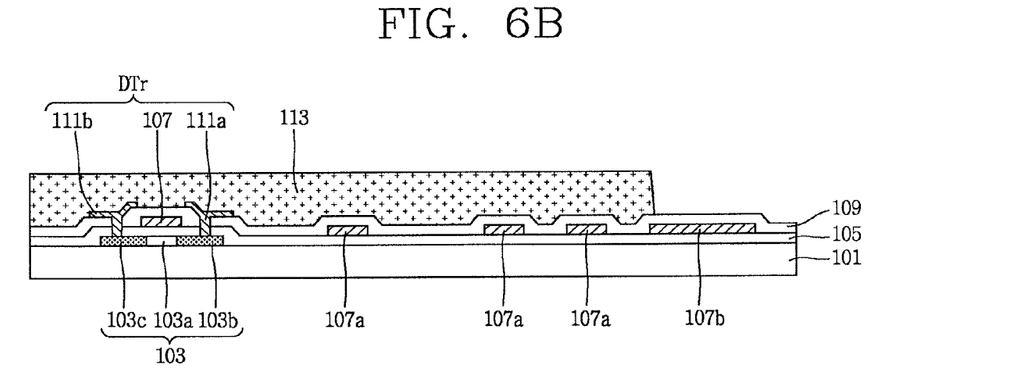

As shown in FIG. 6B, an interlayer insulating layer 109, formed of an insulating material, e.g., an inorganic insulating material such as silicon dioxide ($SiO_2$) or silicon nitride (SiNx), is formed on an entire surface of the substrate including the gate electrode 107 and the gate line (not shown).

Then, the interlayer insulating layer 109 and the gate insulating layer 105 formed below the interlayer insulating layer 109 are selectively patterned, thereby forming semiconductor layer contact holes (not shown), through which the second regions 103b and 103c disposed at two sides of the first region 103a of the semiconductor layer 103 are exposed to outside.

Although not shown, a metallic material layer, which defines the pixel region (P) by crossing the gate line (not shown), is formed on the interlayer insulting layer 109 including the semiconductor layer contact holes (not shown). The metallic material layer may be formed of one of aluminum (Al), aluminum alloy (AlNd), copper (Cu), copper alloy, molybdenum (Mo), molybdenum titanium (MoTi), chrome (Cr) and titanium (Ti), or a combination of at least two of them.

Then, the metallic material layer (not shown) is selectively patterned, thereby forming a data line (not shown) which defines the pixel region (P) by crossing the gate line (not shown), a data driving circuit line (not shown), and a power line (not shown) spaced from the data line. The power line (not shown) may be formed on the gate insulating layer 105 where the gate lines (not shown) have been formed, in a spaced manner from the gate lines (not shown), in parallel thereto.

When the data lines (not shown) are formed, a source electrode 111a and a drain electrode 111b are simultaneously formed. The source electrode 111a and the drain electrode 111b, made of the same metallic material as the data lines (not shown), are formed at a driving region (not shown) and a switching region (not shown) on the interlayer insulating layer 109. The source electrode 111a and the drain electrode 111b are spaced from each other, and contact the second regions 103b and 103c exposed to outside through the semiconductor layer contact holes (not shown). Under such configuration, the semiconductor layer 103, the gate insulating layer 105, the gate electrode 107 and the interlayer insulating layer 109 sequentially deposited on the driving region (not shown), form a driving thin film transistor (DTr), together with the source electrode 111a and the drain electrode 111b which are spaced from each other.

In drawings, all of the data lines (not shown), the source electrode 111a and the drain electrode 111b have a single-layered structure. However, the data lines (not shown), the source electrode 111a and the drain electrode 111b may have a double-layered structure or a three-layered structure.

Although not shown, a switching thin film transistor (not shown), which has the same lamination structure as the driving thin film transistor (DTr), is also formed at the switching region (not shown). The switching thin film transistor (not shown) is electrically connected to the driving thin film transistor (DTr), the gate line (not shown) and the data line (not shown). That is, the gate line (not shown) and the data line (not shown) are connected to a gate electrode (not shown) and a source electrode (not shown) of the switching thin film transistor, respectively. And a drain electrode (not shown) of the switching thin film transistor (not shown) is electrically connected to the gate electrode 107 of the driving thin film transistor (DTr).

The driving thin film transistor (DTr) and the switching thin film transistor (not shown) have the semiconductor layer 103 formed of poly silicon, and are configured as a top gate type. However, the driving thin film transistor (DTr) and the switching thin film transistor (not shown) may be configured as a bottom gate type which has a semiconductor layer formed of amorphous silicon.

In a case where the driving thin film transistor (DTr) and the switching thin film transistor (not shown) are configured as a bottom gate type, they may have a lamination structure of a gate electrode/a gate insulating layer/a semiconductor layer composed of one active layer formed of pure amorphous silicon, and two ohmic layers formed of impurity amorphous silicon and disposed at two sides of the active layer/and a source electrode and a drain electrode spaced from each other. The gate line is formed so as to be connected to the gate electrode of the switching thin film transistor. And the date line is formed so as to be connected to the source electrode.

A planarization layer 113, having a drain contact hole (not shown) through which the drain electrode 111b of the driving thin film transistor (DTr) is exposed to outside, is formed on the driving thin film transistor (DTr) and the switching thin film transistor (not shown). The planarization layer 113 may be formed of an insulating material. For instance, the planarization layer 113 may be formed of one of an inorganic insulating material including silicon dioxide ($SiO_2$) and silicon nitride (SiNx), and an organic insulating material including photo-acryl. In the present invention, the planarization layer 113 is formed of an organic insulating material.

Figure 6C:
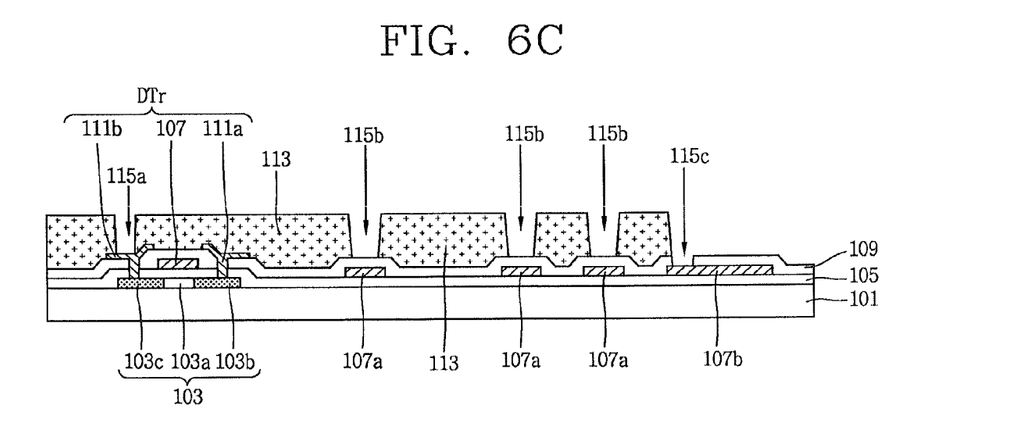

As shown in FIG. 6C, the planarization layer 113 is selectively patterned through an exposing process and a developing process, thereby forming a drain contact hole 115a at the planarization layer 113 in the active area of the substrate 101, the drain contact hole 115a through which the first electrode 117 formed during a subsequent process is electrically connected to the drain electrode 111b.

A plurality of moisture blocking portions 115b, configured to prevent moisture from being introduced into the active area (AA) from outside, are formed at the planarization layer 113 in the non-active area of the substrate 101. Each of the moisture blocking portions 115b is formed as the planarization layer 113 positioned in the non-active area (NA) of the substrate 101 is cut-out with a prescribed width, which is formed along an edge region of the non-active area (NA) of the substrate 101. The moisture blocking portions 115b are formed at the planarization layer 113 positioned above a driving circuit line to which a direct current (DC) is applied, among the ground lines 107b.

Under such configuration, even if moisture is introduced into the OLED device from outside, the moisture is not introduced to the active area (AA) due to the moisture blocking portions 115b of the planarization layer 113 in the non-active area (NA).

When the drain contact hole 115a and the moisture blocking portions 115b are formed, a ground line contact hole 115c through which the ground line 107b is exposed to outside, is simultaneously formed.

Figure 6D:
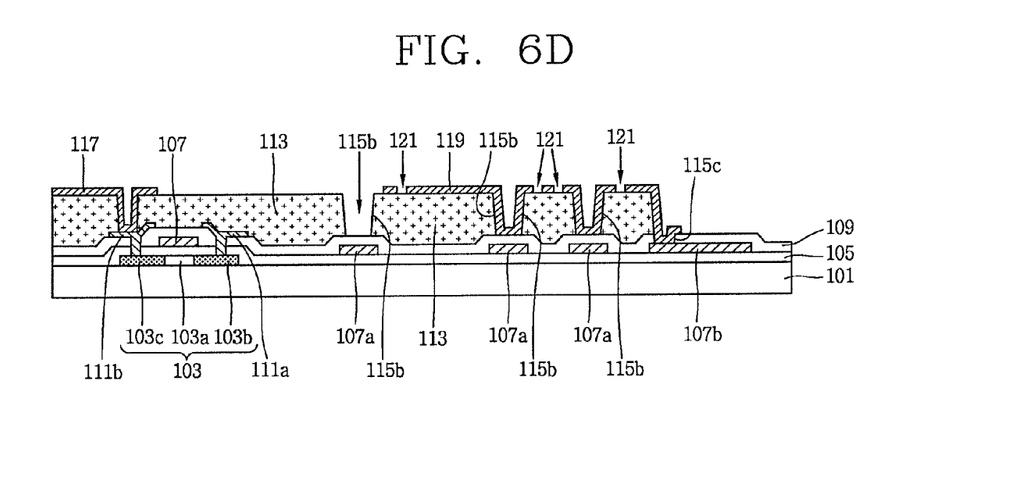

As shown in FIG. 6D, a metallic material layer (not shown) is deposited on the entire surface of the substrate including the planarization layer 113, and then is selectively patterned, thereby forming a first electrode 117 on the planarization layer 113. The first electrode 117 contacts the drain electrode 111b of the driving thin film transistor (DTr) through the drain contact hole 115a, and is formed in a separated manner for each pixel region (P). An auxiliary electrode pattern 119, configured to lower a resistance of the second electrode 127, a cathode formed during a subsequent process, is simultaneously formed on the planarization layer 113 in the non-active area (NA). As the second electrode 127 formed of a transparent conductive material has a large resistance, a problem may occur when a constant current is applied to the second electrode 127. In order to solve such problem, the auxiliary electrode pattern 119 is electrically connected to the second electrode 127 to thus lower a resistance of the second electrode 127. The auxiliary electrode pattern 119 is electrically connected to the second electrode 127 and the ground line 107b. The auxiliary electrode pattern 119 is electrically connected to the ground line 107b via the ground line contact hole 115c. The metallic material layer (not shown) may be formed of one of aluminum (Al), aluminum alloy (AlNd), copper (Cu), copper alloy, molybdenum (Mo), molybdenum titanium (MoTi), chrome (Cr) and titanium (Ti), or a combination of at least two of them.

In order to outgas foreign materials or moisture generated in the planarization layer 113 and which may cause degradation of organic materials inside a light emitting region, anode holes 121 are formed at the auxiliary electrode pattern 119 disposed in the non-active area (NA). The anode holes 121 are simultaneously formed with the first electrode 117 and the auxiliary electrode pattern 119. As the planarization layer 113 and a bank 123 are connected to each other through the anode holes 121, moisture ($H_2O$) introduced into the OLED device from outside may be introduced toward the active area (AA) through the anode holes 121. However, in this case, the moisture is prevented from being introduced to the active area (AA), by the moisture blocking portions 115b of the planarization layer 113 formed below the auxiliary electrode pattern 119.

Figure 6E:
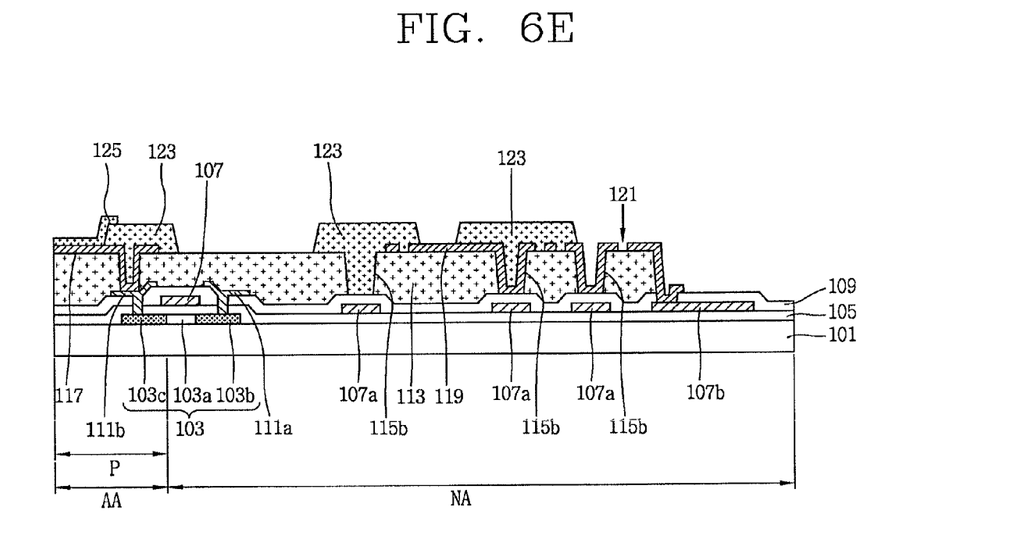

As shown in FIG. 6E, a bank 123, made of an insulating material, such as benzocyclobutene (BCB), polyimide or photo acryl, is formed on the first electrode 117, in the non-active area (NA) outside each pixel region (P). The bank 123 is formed to overlap the edge of the first electrode 117 with enclosing each pixel (P), and has a lattice shape having a plurality of openings in the entire active area (A/A). The bank 123 is also formed in the non-active area (NA), i.e., at an outer portion of a panel.

An organic light-emitting layer 125, composed of organic light-emitting patterns (not shown) which emit red, green and blue light, is formed on the first electrode 117 in each pixel (P) enclosed by the bank 123. The organic light-emitting layer 125 may be configured as a single layer formed of an organic light-emitting material. Although not shown, for enhanced light-emitting efficiency, the organic light-emitting layer 125 may be configured as a multi-layer formed of a hole injection layer, a hole transporting layer, an emitting material layer, an electron transporting layer and an electron injection layer.

Figure 6F:
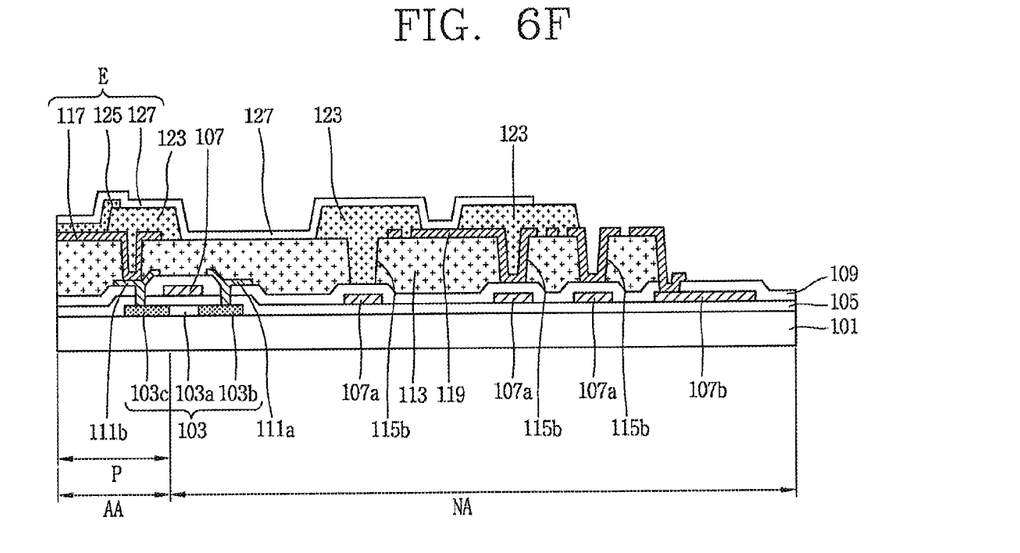

As shown in FIG. 6F, a transparent conductive material layer (not shown), formed of a transparent conductive material including ITO and IZO, is deposited on the entire surface of the substrate including the organic light-emitting layer 125 and the bank 123. Then, the transparent conductive material layer is selectively patterned, thereby forming a second electrode 127 on the active area (AA) of the substrate including the organic light-emitting layer 125 and the bank 123. The first electrode 117, the second electrode 127, and the organic light-emitting layer 125 interposed between the two electrodes 121a, 127 form a light-emitting diode (E). The second electrode 127 is electrically connected to the auxiliary electrode pattern 119.

In the light-emitting diode (E), once a prescribed voltage is applied to the first electrode 117 and the second electrode 127 according to a selected color signal, a hole injected from the first electrode 117 and an electron provided from the second electrode 127 are transferred to the organic light-emitting layer 125 to thus form exciton. When the exciton is transited from an excited state to a ground state, light is generated to be emitted in the form of visible rays. As the generated light is emitted to outside through the transparent second electrode 127, the OLED device 100 implements desired images.

Figure 6G:
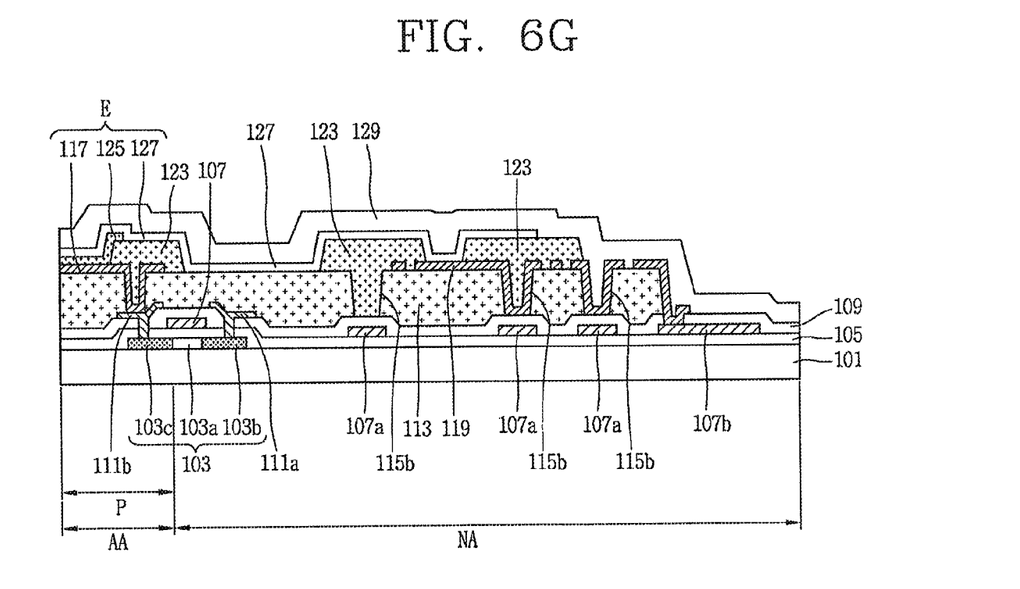

As shown in FIG. 6G, the first passivation layer 129, made of an insulating material, especially, an inorganic insulating material such as silicon dioxide ($SiO_2$) or silicon nitride (SiNx), is formed on the entire surface of the substrate 101 including the second electrode 127. The second electrode 127 alone cannot prevent introduction of moisture into the organic light-emitting layer 125. Accordingly, the first passivation layer 129 is formed on the second electrode 127 to completely prevent introduction of moisture into the organic light-emitting layer 125.

Figure 6H:
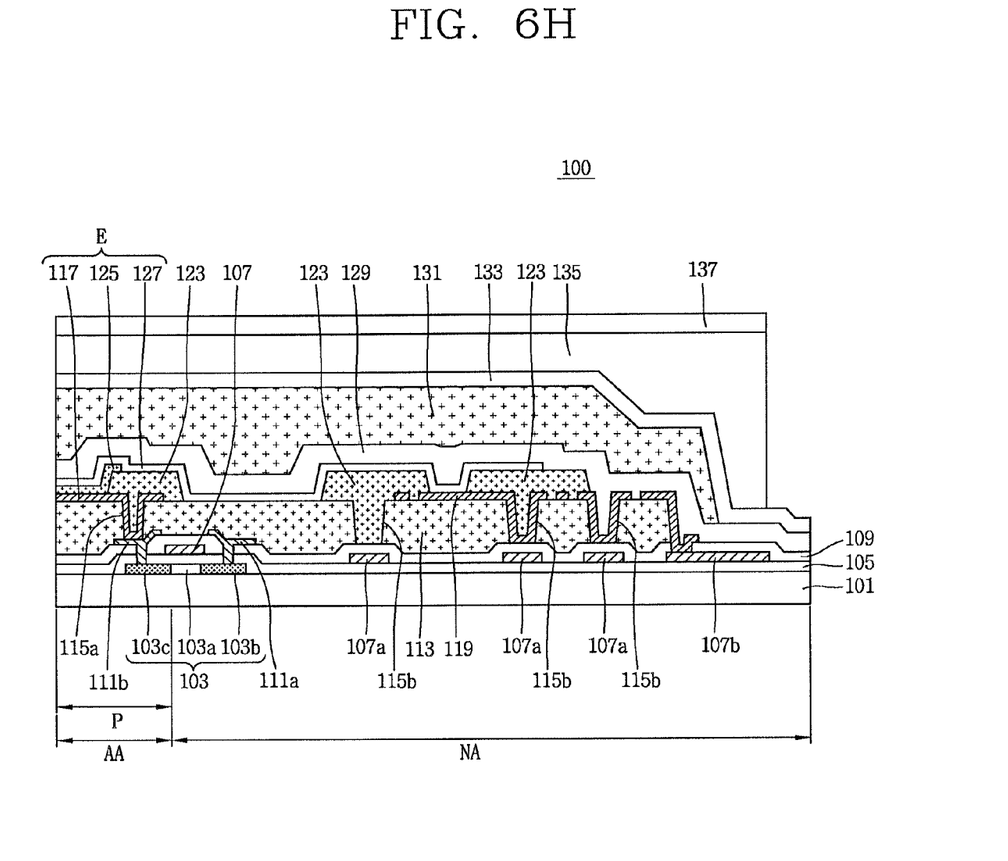

As shown in FIG. 6H, the organic layer 131, made of an organic material such as polymer, is formed on the first passivation layer 129 in the active area (AA). As the polymer of the organic layer 131, may be used olefine-based polymer (polyethylene, polypropylene), polyethylene terephthalate (PET), epoxy resin, fluoro resin, polysiloxane, etc.

For prevention of introduction of moisture into the OLED device through the organic layer 131, a second passivation layer 133, made of an insulating material, e.g., an inorganic insulating material such as silicon dioxide ($SiO_2$) or silicon nitride (SiNx), is further formed on the entire surface of the substrate 101 including the organic layer 131 and the first passivation layer 129.

A barrier film 137 is positioned on the entire surface of the substrate 101 including the second passivation layer 133 in a facing manner, for encapsulation of the light-emitting diode (E). An adhesive 135 is interposed between the substrate 101 and the barrier film 137, so that the substrate 101 and the barrier film 137 can be completely attached to each other without an air layer therebetween. The adhesive 135 is formed of one of transparent frit having an adhesion property, an organic insulating material and a polymer material. In the present invention, the adhesive 135 is configured as a press sensitive adhesive (PSA).

As the substrate 101 and the barrier film 137 are attached to each other by the adhesive 135 to thus form a panel, the fabrication processes of the OLED device 100 according to the present invention are completed.

In the method for fabricating an OLED device according to the present invention, the moisture blocking portions are formed at the planarization layer in the non-active area. Foreign materials or moisture inside the planarization layer, which may cause degradation of organic materials inside a light-emitting region, can be outgassed through the anode holes formed at the auxiliary electrode pattern disposed in the non-active area (NA). The anode holes, through which the planarization layer and the bank are connected to each other, may serve as a path through which moisture introduced from outside flows to the active area (AA). However, even if moisture introduced from outside flows through the anode holes, the moisture can be prevented from moving to the active area (AA) by the moisture blocking portions of the planarization layer formed below the auxiliary electrode pattern. This can allow a top emission type OLED device adopting a face seal structure, to have an enhanced environment reliability.

In the method for fabricating an OLED device according to the present invention, moisture is prevented from being introduced to the active area (AA) by the moisture blocking portions of the planarization layer formed below the auxiliary electrode pattern. This can allow a top emission type OLED device adopting a face seal structure, to have an enhanced environment reliability.

The foregoing embodiments and advantages are merely exemplary and are not to be considered as limiting the present disclosure. The present teachings can be readily applied to other types of apparatuses. This description is intended to be illustrative, and not to limit the scope of the claims. Many alternatives, modifications, and variations will be apparent to those skilled in the art. The features, structures, methods, and other characteristics of the exemplary embodiments described herein may be combined in various ways to obtain additional and/or alternative exemplary embodiments.

As the present features may be embodied in several forms without departing from the characteristics thereof, it should also be understood that the above-described embodiments are not limited by any of the details of the foregoing description, unless otherwise specified, but rather should be considered broadly within its scope as defined in the appended claims, and therefore all changes and modifications that fall within the metes and bounds of the claims, or equivalents of such metes and bounds are therefore intended to be embraced by the appended claims.

What is claimed is:

1. A method for fabricating an organic light emitting diode device, the method comprising:
    providing a substrate divided into an active area including a plurality of pixel regions, and a non-active area formed outside the active area;
    forming a switching thin film transistor and a driving thin film transistor at each of the pixel regions on the substrate;
    forming a planarization layer on the substrate including the switching thin film transistor and the driving thin film transistor;
    forming a moisture blocking portion at the planarization layer in the non-active area;
    forming, on the planarization layer, a first electrode connected to a drain electrode of the driving thin film transistor;
    forming a bank in the non-active area outside each pixel region of the substrate including the first electrode;

forming an organic light emitting layer on the first electrode in the pixel region;

forming a second electrode on an entire surface of the substrate including the organic light emitting layer;

forming a first passivation layer on an entire surface of the substrate including the second electrode;

forming an organic layer on the first passivation layer;

forming a second passivation layer on the organic layer and the first passivation layer;

forming a barrier film so as to face the substrate; and forming an adhesive between the substrate and the barrier film, the adhesive configured to attach the substrate and the barrier film to each other to thus implement a panel state.

2. The method of claim 1, wherein the moisture blocking portion is formed in at least one in number, along an edge region of the non-active area of the substrate.

3. The method of claim 1, wherein the moisture blocking portion is formed at the planarization layer corresponding to driving circuit lines, in the non-active area of the substrate.

4. The method of claim 3, wherein the moisture blocking portion is formed at the planarization layer positioned above a driving circuit line to which a direct current is applied, among the gate driving circuit lines.

5. The method of claim 1, wherein an auxiliary electrode pattern, electrically connected to the first electrode and having a plurality of anode holes, is formed on the planarization layer, in the non-active area of the substrate.

6. The method of claim 5, wherein the auxiliary electrode pattern is simultaneously formed with the first electrode.

7. The method of claim 1, wherein the substrate is configured as one of a glass substrate, a flexible glass substrate and a plastic substrate.

* * * * *